United States Patent
Wang

(10) Patent No.: US 11,874,649 B2
(45) Date of Patent: Jan. 16, 2024

(54) METHODS AND SYSTEMS FOR CLEANING PROCESS SEQUENCE MANAGEMENT

(71) Applicant: Applied Materials, Inc., Santa Clara, CA (US)

(72) Inventor: Chongyang C. Wang, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/522,634

(22) Filed: Nov. 9, 2021

(65) Prior Publication Data
US 2023/0147627 A1  May 11, 2023

(51) Int. Cl.
*G05B 19/418* (2006.01)

(52) U.S. Cl.
CPC .......... *G05B 19/41865* (2013.01); *G05B 2219/45031* (2013.01)

(58) Field of Classification Search
CPC ............ G05B 19/41865; G05B 2219/45031
See application file for complete search history.

(56) References Cited

U.S. PATENT DOCUMENTS

| | | |
|---|---|---|
| 7,123,980 B2 | 10/2006 | Funk et al. |
| 2017/0032058 A1* | 2/2017 | Arbel ............... G06F 30/33 |
| 2018/0046965 A1* | 2/2018 | Berlandier ....... G06Q 10/06316 |
| 2018/0267512 A1 | 9/2018 | Yamamoto |
| 2019/0103293 A1 | 4/2019 | Kim et al. |
| 2020/0026258 A1 | 1/2020 | Seo et al. |
| 2021/0397152 A1* | 12/2021 | Chen ................ G05B 19/0426 |
| 2022/0037132 A1* | 2/2022 | Yu ..................... C23C 16/4405 |

FOREIGN PATENT DOCUMENTS

| | | |
|---|---|---|
| CN | 112965438 A | 6/2021 |
| KR | 10-2016-0148796 A | 12/2016 |

OTHER PUBLICATIONS

International Search Report and Written Opinion of International Application No. PCT/US2022/047471 dated Feb. 20, 2023, 10 pages.

* cited by examiner

*Primary Examiner* — Thomas C Lee
*Assistant Examiner* — Tyler Dean Hedrick
(74) *Attorney, Agent, or Firm* — Lowenstein Sandler LLP

(57) ABSTRACT

Methods and systems for cleaning process sequence management are provided. An indication is received from a client device of a sequence of cleaning operations associated with a substrate process at a manufacturing system. An indication of one or more cleaning criteria that trigger initiation of the sequence of cleaning operations during a cleaning process at a process chamber of the manufacturing system is also received. A set of instructions corresponding to the sequence of cleaning operations is generated. In response to a detection that at least one of the one or more cleaning criteria is satisfied, the generated set of instructions are executed to initiate the sequence of cleaning operations at the process chamber.

20 Claims, 9 Drawing Sheets

| PRIORITY 336 | TRIGGERING EVENT 338 | CLEANING PROCESS SEQUENCE 332 ||||
| --- | --- | --- | --- | --- |
| | | TRIGGERING CONDITION 340 | LOOP 342 | RESET VARIABLE 344 | CLEAN RECIPE(S) 346 |
| 1 | ALWAYS | CHAMBER IDLE TIME >= 1200 SECONDS | 2 | AUTO RESET | CLEAN RECIPE 1, CLEAN RECIPE 2 |
| 2 | SUBSTRATE ID CHANGED | SUBSTRATE COUNT >= 1 | 1 | AUTO RESET | CLEAN RECIPE 3 |
| • • | | | | | |
| N | | | | | |
| ADD STEPS/OPERATIONS 334 |||||

FIG. 3B

| | | CLEANING PROCESS SEQUENCE 352 | | | |
|---|---|---|---|---|---|
| PRIORITY 336 | TRIGGERING EVENT 338 | TRIGGERING CONDITION 340 | LOOP 342 | RESET VARIABLE 344 | CLEAN RECIPE(S) 346 |
| 1 | ALWAYS | SUBSTRATE COUNT >=1 AND RF HOURS >= 8 | 2 | AUTO RESET | CLEAN RECIPE 4 |
| 2 | ALWAYS | SUBSTRATE COUNT >=2 AND RF HOURS >= 16 | 1 | AUTO RESET | CLEAN RECIPE 5 |
| 3 | LAST SUBSTRATE FROM CARRIER | SUBSTRATE COUNT >=8 AND RF HOURS >= 24 | 1 | AUTO RESET | CLEAN RECIPE 6 |
| ... | | | | | |
| N | | | | | |
| ADD STEPS/OPERATIONS 334 | | | | | |

FIG. 3C

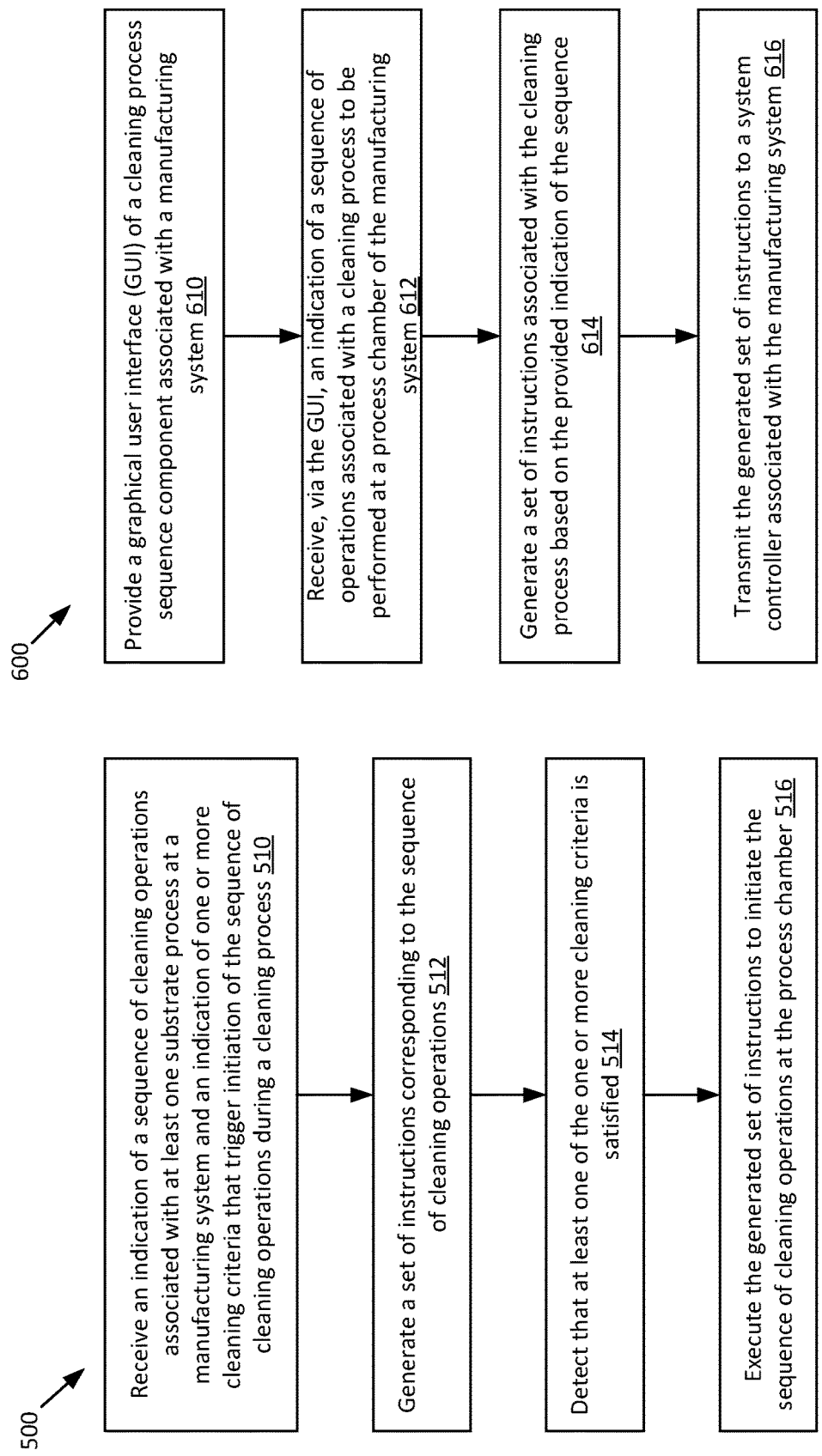

METHODS AND SYSTEMS FOR CLEANING PROCESS SEQUENCE MANAGEMENT

TECHNICAL FIELD

Embodiments of the present disclosure relate, in general, to manufacturing systems and more particularly to cleaning process sequence management.

BACKGROUND

A substrate process (e.g., an etch process, a deposition process, etc.) can be performed for a substrate at a process chamber of a manufacturing system. A cleaning process can be performed to prepare the process chamber for the conditions of the substrate process before the substrate is placed at the process chamber and the substrate process is initiated. Such cleaning processes are referred to herein as pre-cleaning processes. Another cleaning process can be performed after completion of the substrate process, e.g., to remove particles and/or other materials within the chamber after completion of the substrate process, to prepare the chamber for subsequent substrate processes performed for other substrates, etc. Such cleaning processes are referred to herein as post-cleaning processes. As electronic devices become more detailed and more complex, the substrate processes performed at a manufacturing system can become more advanced and more complex. An operator of the manufacturing system can seek to adjust and/or enhance the cleaning processes performed before and/or after each substrate process to maintain the environment within the process chambers in accordance with such advanced and complex substrate processes. In conventional systems, it can be difficult for the operator to adjust the operations and/or sequence of operations of a cleaning process.

SUMMARY

Some of the embodiments described cover a method including receiving, from a client device coupled to a manufacturing system, an indication of a sequence of cleaning operations associated with at least one substrate process at the manufacturing system and an indication of one or more cleaning criteria that trigger initiation of the sequence of cleaning operations during a cleaning process at a process chamber of the manufacturing system. The method further includes generating a set of instructions corresponding to the sequence of cleaning operations. The method can further include, responsive to detecting that at least one of the one or more cleaning criteria is satisfied, executing the generated set of instructions to initiate the sequence of cleaning operations at the process chamber.

In some embodiments, a system includes a memory and a processing device coupled to the memory. The processing device is to provide a graphical user interface (GUI) of a cleaning process sequence component associated with a manufacturing system. The GUI enables a user of the manufacturing system to provide a sequence of operations for cleaning processes at the manufacturing system. The processing device can also receive, via the GUI, an indication of a sequence of operations associated with a cleaning process to be performed at a process chamber of the manufacturing system. The processing device can also generate a set of instructions associated with the cleaning process based on the provided indication of the sequence. The processing device can also transmit the generated set of instructions to a system controller associated with the manufacturing system.

In some embodiments, a non-transitory computer readable storage medium includes instructions that, when executed by a processing device, cause the processing device to receive, from a client device connected to a manufacturing system, an indication of a sequence of cleaning operations associated with at least one substrate process at the manufacturing system and an indication of one or more cleaning criteria that trigger initiation of the sequence of cleaning operations during a cleaning process at a process chamber of the manufacturing system. The processing device can also generate a set of instructions corresponding to the sequence of cleaning operations. The processing device can also, responsive to detecting that at least one of the one or more cleaning criteria is satisfied, execute the generated set of instructions to initiate the sequence of cleaning operations at the process chamber.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 3A-3C illustrate example graphical user interfaces (GUIs) to enable a user of a manufacturing system to provide a sequence of cleaning operations, according to aspects of the present disclosure.

FIG. 5 is a flow diagram for an example method of cleaning process sequence management, according to aspects of the present disclosure.

FIG. 6 is a flow diagram for an example method of cleaning process sequence management, according to aspects of the present disclosure.

DETAILED DESCRIPTION OF EMBODIMENTS

Figure 1:
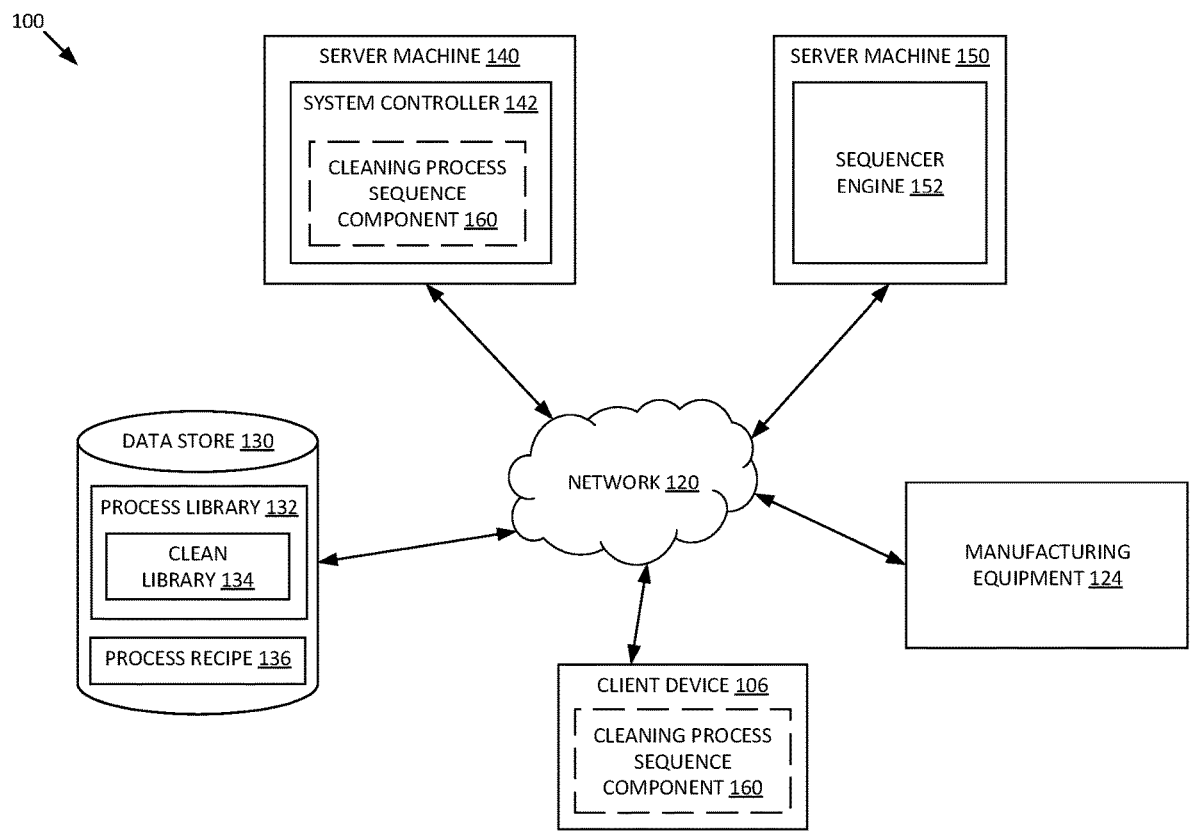
FIG. 1 depicts an illustrative computer system architecture, according to aspects of the present disclosure.

Embodiments disclosed herein include methods and systems for cleaning process sequence management. A manufacturing system can include process chambers that are configured to perform processes for a substrate placed within the process chambers (referred to as a substrate process herein). In some embodiments, a substrate process can include a deposition process (e.g., a chemical vapor deposition (CVD) process, an atomic layer deposition (ALD) process, a physical vapor deposition (PVD) process, etc.) to deposit a thin film on a surface of a substrate. In other or similar embodiments, a substrate process can include an etch process to etch away portions of a material deposited on the surface of a substrate to create a target pattern. Cleaning processes can be performed at the respective process chambers of the manufacturing system to maintain the components of the process chamber and an environment within the process chamber for each substrate process performed. A pre-cleaning process refers to a cleaning process that is performed before a substrate is placed in a process chamber and a substrate process is initiated. For example, a pre-cleaning process can be performed at a process chamber to deposit a protective film on the surfaces of one or more components of the process chamber (e.g., a chamber seasoning process) before an etch process is initiated. A post-cleaning process refers to a cleaning process that is performed after a substrate process is completed at a process chamber and a processed substrate is removed from the chamber. For example, a post-cleaning process can be performed to remove material deposited on the surfaces of one or more components of the process chamber during a deposition process. In another example, a post-cleaning process can be performed to remove particles that remain in a process chamber after completion of an etch process.

An operator of the manufacturing system (e.g., an engineer, etc.) can seek to adjust and/or enhance cleaning processes performed at a manufacturing system. In conventional systems, to adjust or enhance a cleaning process for a manufacturing system, the operator can provide information associated with a target cleaning process adjustment or enhancement to an entity responsible for managing control logic associated with the manufacturing system. The entity can design and/or develop a program associated with the target cleaning process adjustment or enhancement and run tests or experiments on the program. Once the program is successfully tested and validated for use at the manufacturing system, the entity can provide the program to the operator of the manufacturing system and the operator can load execute the program (e.g., via a processing device associated with the manufacturing system) to perform the cleaning process in accordance with the adjustment or enhancement at a process chamber.

In view of the above, it can take a significant amount of time to implement even a simple adjustment or enhancement for a cleaning process at a manufacturing system. Additionally, as electronic devices become more detailed and complex, the substrate processes performed at a manufacturing system can become more advanced and complex and frequent updates can be implemented to respective substrate process recipes. In some instances, the pre- and/or post-cleaning processes are updated or enhanced to account for the updates to a respective substrate process recipe and the updated substrate process recipe cannot be implemented until the updated or enhanced cleaning processes are available for the manufacturing system. As it can take a significant amount of time to implement an adjustment or enhancement for a cleaning process at a manufacturing system, it can accordingly take a significant amount of time for an updated substrate process recipe to be implemented at the manufacturing system. Accordingly, the operator can be delayed in implementing an updated substrate process recipe at a manufacturing system and, in some instances, the process chamber of the manufacturing system can sit idle until the adjustment or enhancement for the cleaning process is available at the manufacturing system. The delayed implementation and/or idle time period for the processing chamber can decrease the throughput for the manufacturing system, which can increase an overall system latency and decrease an overall system efficiency.

In some instances, the process chambers at a manufacturing system can be configured to perform different types of substrate processes. For example, the process chambers at a manufacturing system can be configured to perform etch processes and deposition processes. In such systems, a control logic associated with each process chamber can be specific to the type of substrate process performed at the process chamber. For example, the control logic for an etch chamber can be different from the control logic for a deposition chamber. To update or enhance a cleaning process performed at the respective types of process chamber, an operator of the manufacturing system can request the updated be implemented in the control logic for each type of process chamber. The entity associated with managing the control logic for the process chambers can design, develop, and/or test separate programs for the control logic associated with each type of process chamber, as described above. Accordingly, it can take an even larger amount of time to update or enhance a cleaning process for different types of process chambers of a manufacturing system, and the delayed implementation and/or idle time for a process chamber (i.e., for implementation of an updated substrate process recipe) can further decrease the throughput for the manufacturing system, which can further increase the overall system latency and further decrease overall system efficiency.

Embodiments of the present disclosure are directed to methods and systems for cleaning process management. A cleaning process sequence component (e.g., residing on a client device connected to a manufacturing system, of a system controller associated with the manufacturing system, etc.) can provide a graphical user interface (GUI) to a user (e.g., an operator, an engineer, etc.) of the manufacturing system via the client device connected to the manufacturing system. The GUI can enable the user to add and/or modify a type of operation and/or a sequence of operations for a cleaning process performed at a process chamber of the manufacturing system. In some embodiments, the GUI can enable the user to add and/or modify a type of operation and/or a sequence of operations for cleaning process associated with multiple types of substrate processes (e.g., etch processes, deposition processes, etc.) performed at the manufacturing system.

The cleaning process sequence component can receive an indication of a sequence of operations associated with a cleaning process via the GUI. Responsive to receiving the indication of the sequence of operations, the cleaning process sequence component can generate a set of instructions associated with the cleaning process based on the provided sequence of operations. For example, the cleaning process sequence component can determine one or more cleaning criteria that trigger initiation of the sequence of operations at the process chamber and can update a semantic dependency tree associated with the cleaning process to include one or more nodes associated with determined cleaning criteria and the sequence of operations. The cleaning process sequence component can translate each cleaning operation associated with a respective node of the updated semantic dependency tree into a respective instruction of the set of instructions. The cleaning process sequence component can transmit the generated set of instructions to the system controller (or another component of the system controller), in some embodiments. During a runtime of the manufacturing system, the system controller can execute the set of instructions to initiate the cleaning process at the process chamber. For example, in response to detecting that the cleaning criteria associated with the sequence of operations provided via the GUI is satisfied, the system controller can execute the instructions associated with the sequence of operations to perform at least a portion of the cleaning process at the process chamber.

Implementations of the present disclosure address the above described deficiencies of the current technology by providing techniques for enabling a user (e.g., an operator, an engineer, etc.) of a manufacturing system to manage adjust or enhance a cleaning process at a manufacturing system via a client device connected to the manufacturing system. The GUI provided by the cleaning process sequence component via the client device can enable the user to add and/or modify a type of operation and/or a sequence of operations for a cleaning process associated with a type of substrate process performed for a substrate at a manufacturing system. The cleaning process sequence component can generate a set of instructions associated with the user-provided sequence of operations for the cleaning process and a system controller can execute the set of instructions in accordance with a cleaning criteria associated with the cleaning process, as described above. Accordingly, the user of the manufacturing system can implement an update or adjustment to a cleaning process at a manufacturing system without requesting the update or adjustment of the cleaning from an entity that maintains the control logic for the manufacturing system. Therefore, updating or adjusting a cleaning process at a manufacturing system can take less time, and the amount of time to implement a new substrate process recipe is significantly reduced. Accordingly, an overall throughput of the manufacturing system can be significantly increased, which can increase an overall efficiency and decrease an overall latency of the manufacturing system.

FIG. 1 depicts an illustrative computer system architecture 100, according to aspects of the present disclosure. In some embodiments, computer system architecture 100 can be included as part of a manufacturing system (e.g., for processing substrates, etc.). Computer system architecture 100 (also referred to herein as computer system 100) includes a client device 106, manufacturing equipment 124, a data store 130, and one or more server machines (e.g., server machine 140, server machine 150, etc.). In some embodiments, client device 106, manufacturing equipment 124, data store 130, server machine 140 and/or server machine 150 can be connected via a network 120. In some embodiments, network 120 can include a public network (e.g., the Internet), a private network (e.g., a local area network (LAN) or wide area network (WAN)), a wired network (e.g., Ethernet network), a wireless network (e.g., an 802.11 network or a Wi-Fi network), a cellular network (e.g., a Long Term Evolution (LTE) network), routers, hubs, switches, server computers, and/or a combination thereof.

Manufacturing equipment 124 can include equipment that produces products (e.g., electronic devices, etc.) following a recipe or performing runs over a period of time. In some embodiments, manufacturing equipment 124 can include one or more process chambers configured to perform a substrate process on one or more substrates. A substrate process can refer to a deposition process (e.g., a process to deposit a thin layer of material on a surface of a substrate), an etch process (e.g., a process to etch away portions of a material deposited on a surface of a substrate), and so forth. In some embodiments, a deposition process can include a CVD process, an ALD process, a PVD process, etc. In some embodiments, the one or more process chambers can be configured to perform a cleaning process before, after, and/or during a substrate process performed for a substrate. A pre-cleaning process refers to a series or sequence of operations to prepare a process chamber and/or a substrate for a substrate process performed at the process chamber. For example, a pre-cleaning process for an etch chamber can include one or more operations associated with depositing a protective material on the surfaces of one or more components of the etch chamber to protect the components during an etch process. A post-cleaning process refers to a series or sequence of operations performed after a substrate process is completed at the process chamber. For example, a post-cleaning process can include one or more operations associated with removing a material deposited on the surfaces of one or more components of a deposition chamber after completion of a deposition process. In another example, a post-cleaning process can include one or more operations associated with removing one or more particles from an etch chamber after an etch process is performed to etch away portions of a material from a surface of a substrate. In some embodiments, the post-cleaning process can be performed before or after a substrate is removed from the process chamber. In additional or alternative embodiments, the post-cleaning process can be performed after another object (e.g., a dummy substrate, a dummy wafer) is placed in the process chamber after a processed substrate is removed.

In some embodiments, system controller 142 (e.g., residing on server machine 140) can be configured to execute instructions associated with performing one or more processes at manufacturing equipment 124. In some embodiments, system controller 142 can be configured to execute instructions associated with different types of processes associated with different types of equipment. For example, system controller 142 can be configured to execute one or more sets of instructions associated an etch process to facilitate performance of the etch process at a process chamber. In another example, system controller 142 can be configured to execute one or more sets of instructions associated with a pre- and/or post-clean process to facilitate performance of the pre- and/or post-clean process at the process chamber. In yet another example, system controller 142 can be configured to execute instruction associated with a load lock, an aligner station, a cooling station, a storage station, a metrology station, and so forth of manufacturing equipment 124.

Data store 130 can store process libraries 132 associated with each type of process that can be performed at manufacturing equipment 124. A library refers to a set of resources, such as executable program files, configuration files, etc., associated with performing a process at manufacturing equipment 124. In some embodiments, a process library 132 can include one or more sets of instructions executed by system controller 142 to perform a particular step or operation of a process at manufacturing equipment 124. As illustrated in FIG. 1, data store 130 can include a clean library 134 that includes one or more sets of instructions executed by system controller 142 to perform pre- and/or post-clean processes that can be performed at a process chamber. Data store 130 can also store one or more process recipes 136. A process recipe 136 can indicate one or more steps and/or operations that are to be performed during a particular process at manufacturing equipment 124. A process recipe 126 can also indicate one or more process settings (e.g., process chamber temperature, process chamber pressure, process chamber gas composition, etc.) to be applied during performance of the particular process. System controller 142 can execute instructions included in one or more process libraries 132 in view of a process recipe 136 for a particular process, in accordance with embodiments described herein.

Sequencer engine 152 (e.g., residing on server machine 150) can be configured to define a sequence of processes and/or steps or operations of processes to be performed at manufacturing equipment 124. Sequencer engine 152 can obtain (e.g., from client device 106) an indication of a target sequence of processes to be performed at manufacturing equipment 124 and can identify one or more process recipes 136 associated with each of the sequence of processes from data store 130. As indicated above, the instructions associated with one or more steps or operations of the process recipes 136 can be identified in one or more process libraries 132. For example, sequencer engine 152 can obtain an indication of a target sequence for a post-clean process to be performed at a process chamber after completion of an etch process and/or a deposition process. Sequencer engine 152 can identify one or more process recipes 136 associated with each step or operation of the post-post clean process. The identified process recipes 136 can correspond to one or more clean libraries 134 of data store 130. Sequencer engine 152 can generate a sequence of instructions to be executed in accordance with the target sequence for the post-clean process based on instructions included in the one or more corresponding clean libraries 134 at data store 130. Sequencer engine 152 can provide the generated sequence of instructions to system controller 142, and system controller 142 can execute the generated sequence of instructions to perform the post-clean process. Further details regarding sequencer engine 152 are provided with respect to FIG. 2.

As indicated above, sequencer engine 152 can obtain an indication of a target sequence of processes from client device 106. Client device 106 can be, or can be a component of, devices, such as, but not limited to: televisions, smart phones, cellular telephones, personal digital assistants (PDAs), portable media players, netbooks, laptop computers, electronic book readers, tablet computers, desktop computers, set-top boxes, gaming consoles, a computing device for an autonomous vehicles, a surveillance device, and the like. In some embodiments, a cleaning process sequence component 160 of system 100 (also referred to as cleaning component 160 herein) can provide a graphical user interface (GUI) via client device 106, which enables a user of client device 106 to provide an indication of the sequence of processes to be performed at manufacturing equipment 124. In some embodiments, the cleaning component 160 can be a logical component of system controller 142 and/or sequencer engine 152. Accordingly, one or more portions of the cleaning component 160 can reside at server machine 140 and/or server machine 150, in some embodiments. Further details regarding the cleaning component 160 of system 100, system controller 142, and sequencer engine 152 are provided herein.

In some implementations, client device 106, manufacturing equipment 124, data store 130, and/or server machines 140-150, can be, or can include, one or more computing devices computing devices (such as a rackmount server, a router computer, a server computer, a personal computer, a mainframe computer, a laptop computer, a tablet computer, a desktop computer, etc.), data stores (e.g., hard disks, memories, databases), networks, software components, and/or hardware components that can be used to enable object detection based on an image. It should be noted that in some other implementations, the functions client device 106, manufacturing equipment 124, data store 130, and/or server machines 140-150 can be provided by a fewer number of machines. For example, in some implementations server machines 140 and/or 150 can be integrated into a single machine, while in other implementations server machines 140 and 150 can be integrated into multiple machines. In addition, in some implementations one or more of server machines 140 and 150 can be integrated into client device 106.

Figure 2:
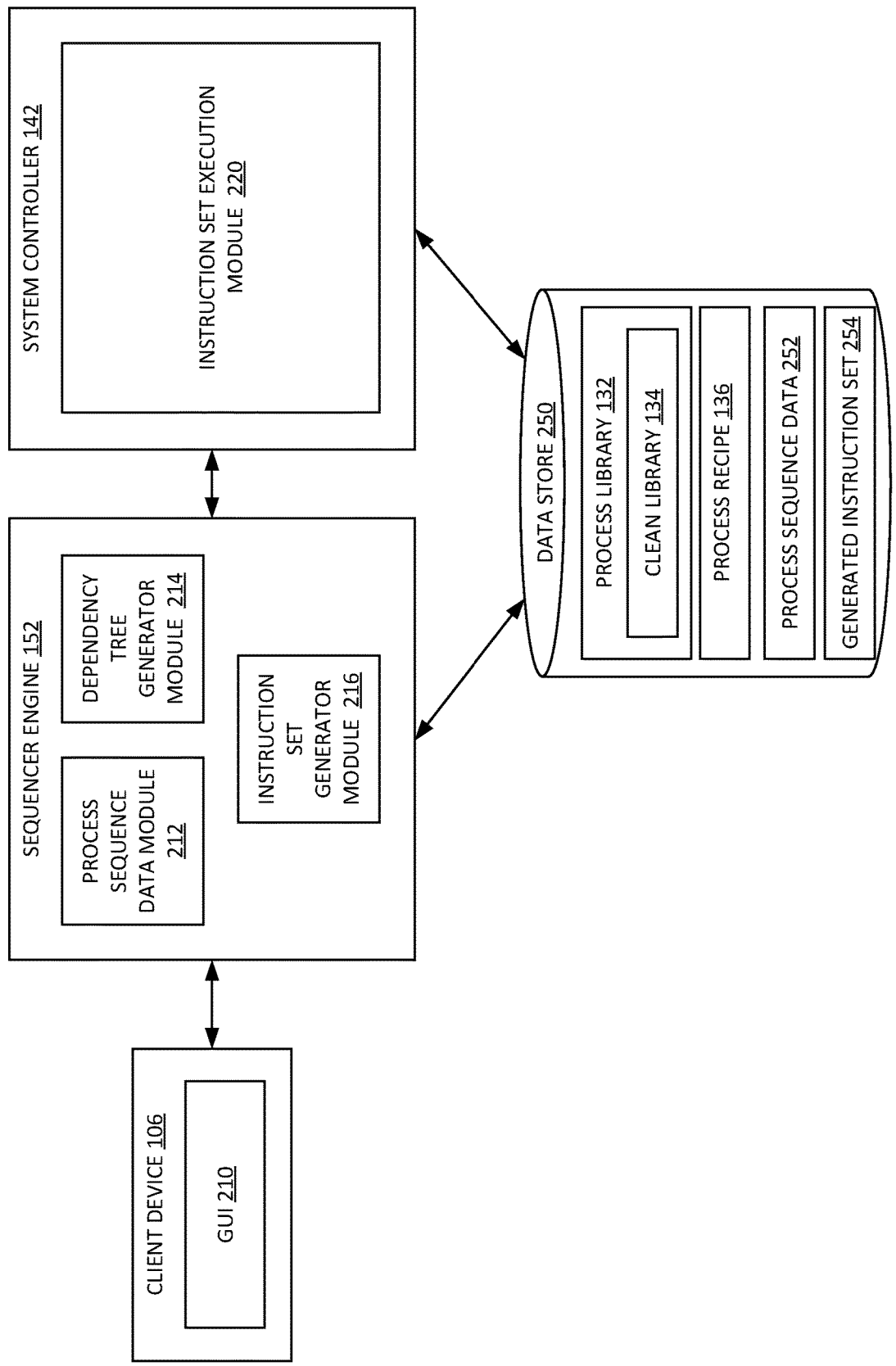
FIG. 2 is a block diagram of an example sequencer engine, according to aspects of the present disclosure.

FIG. 2 is a block diagram of an example sequencer engine 152 and an example system controller 142, according to aspects of the present disclosure. As illustrated in FIG. 2, sequencer engine 152 can include a process sequence data module 212, a dependency tree generator module 214, and/or an instruction set generator module 216, in some embodiments. System controller 142 can include an instruction set execution module 220, in some embodiments. Some embodiments of the present disclosure are described with respect to a cleaning process sequence component 160 (also referred to as a cleaning component) of system 100. Sequencer engine 152 and/or system controller 142 may be connected (e.g., via a network) to data store 250. In some embodiments, data store 250 may correspond to data store 113, described with respect to FIG. 1.

In some embodiments, the cleaning component can include each module of sequencer engine 152 and system controller 142. For example, the cleaning component can include process sequence data module 212, dependency tree generator module 214, instruction set generator module 216, and/or instruction set execution module 220 of sequencer engine 152 and system controller 142. In other or similar embodiments, the cleaning component can include one or modules of sequencer engine 152. For example, the cleaning component can include process sequence data module 212, dependency tree generator module 214, and/or instruction set generator module 216. It should be noted that although some embodiments of the present disclosure are described with respect to one or more modules of sequencer engine 152 and/or system controller 142, each embodiments of the present disclosure can be performed by one or more modules associated with the cleaning component.

Figure 3A:
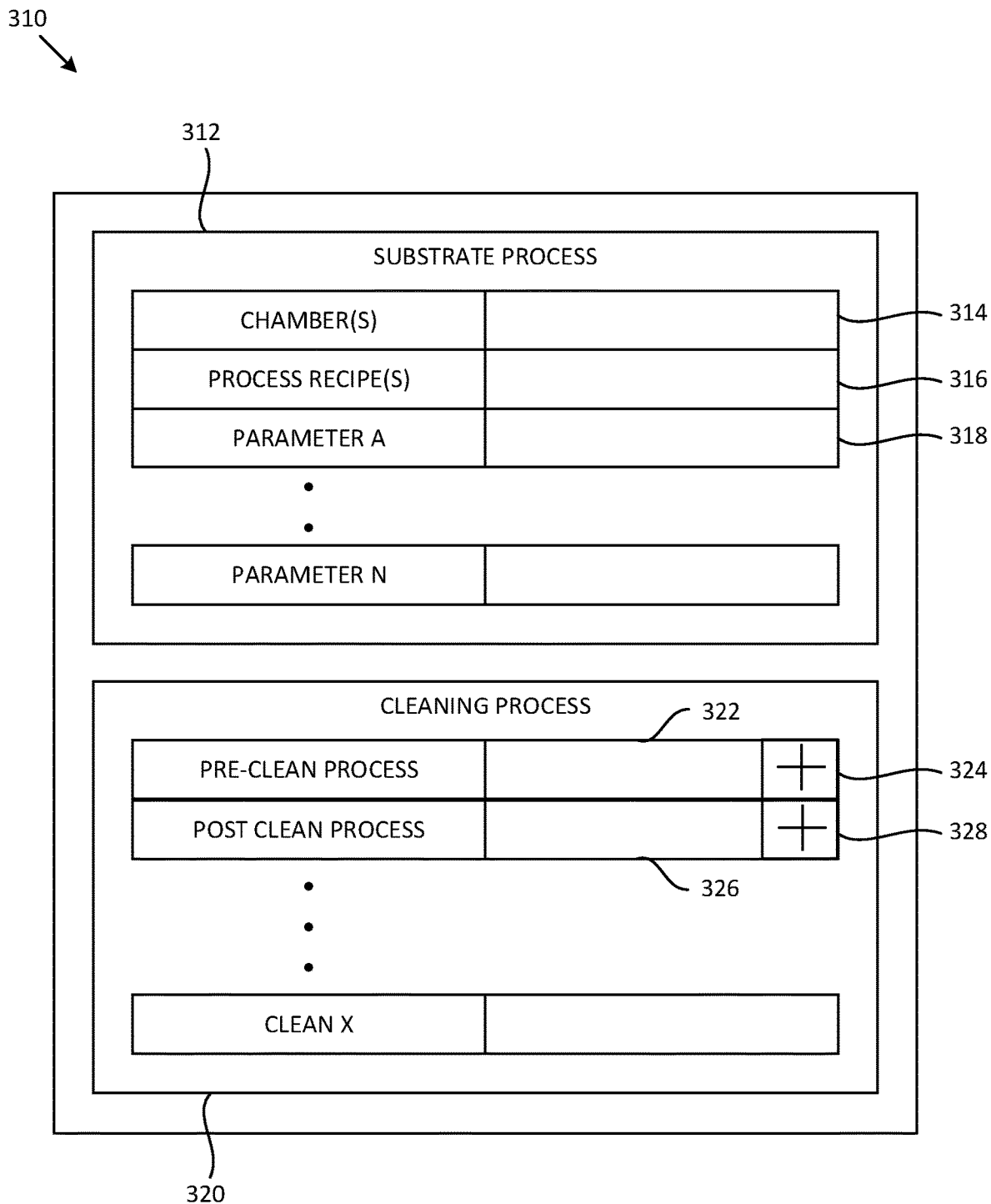

As described with respect to FIG. 1, the cleaning component of system 100 can provide a graphical user interface (GUI) 210, which enables a user of system 100 to provide an indication of a target sequence of processes to be performed at manufacturing equipment 124. FIG. 3A illustrates an example portion 310 of GUI 210, according to aspects of the present disclosure. In some embodiments, portion 310 of GUI 210 can include a first section 312 and a second section 320. Section 312 can include one or more GUI elements that enable a user of system 100 to provide an indication of one or more substrate processes to be performed at manufacturing equipment 124. For example, as illustrated in FIG. 3A, section 312 can include a GUI element 314 that enables a user to indicate one or more pieces of equipment (e.g., process chambers) of manufacturing equipment 124 that are to perform the indicated process. Section 312 can also include another GUI element 316 that enables the user to indicate the one or more process recipes 136 (e.g., stored at data store 250) that are to be performed at the indicated pieces of equipment, and one or more additional GUI elements 318 that enable the user to indicate one or more parameter settings (e.g., process temperature, process gas composition, process chamber pressure, etc.) associated with the indicated process recipes. In some embodiments, GUI elements 314, 316, and/or 318 can include a text box that enables the user to provide text indicating the data associated with the substrate process (e.g., the piece of equipment that is to perform the process, the one or more process recipes to be performed, one or more parameter settings for the process recipes, etc.). In other or similar embodiments, GUI elements 314, 316, and/or 318 can include other types of GUI elements (e.g., a drop down menu, etc.) that enable the user to provide and/or select data to be associated with a substrate process. FIG. 3A depicts a simplified example section 312 of a portion 310 of GUI 210 (i.e., section 312 includes GUI elements 318 that enable the user to indicate settings for parameters A-N). However, in additional or alternative embodiments, section 312 can include multiple additional GUI elements 318 that enable the user to indicate multiple settings and/or ranges of settings for each operation or step of process recipes 136.

In other or similar embodiments, section 320 of portion 310 can include one or more GUI elements that enable the user of system 100 to provide an indication of one or more cleaning processes (also referred to as clean processes herein) to be performed at manufacturing equipment 124. As described above, a cleaning process refers to a process performed before (i.e., a pre-clean process), during, and/or after (i.e., a post-clean process) a substrate process at manufacturing equipment 124. In some embodiments, the one or more cleaning process can be associated with the substrate process indicated in section 312 of portion 310. For example, if the user of system 100 indicates, via section 312, that an etch process is to be performed via one or more process chambers of manufacturing equipment 124, the cleaning process indicated by section 320 can be associated with the etch process and can be performed before, during, and/or after the etch process. It should be noted that some embodiments the present disclosure are directed to an etch process and/or a deposition process, or a cleaning process for an etch process and/or a deposition process, at a process chamber of manufacturing equipment 124. However, embodiments of the present disclosure can be applied to any type of process, or cleaning process, performed at any piece of equipment of manufacturing equipment 124.

In some embodiments, section 320 can include one or more GUI elements (e.g., GUI elements 322, 324, etc.) that enable the user to provide an indication of a pre-cleaning process that is to be performed at the one or more pieces of equipment (i.e., before the substrate process indicated by section 312 is performed). GUI element 322 can enable the user to provide (e.g., type) or select (e.g., via a drop down menu, etc.) an existing pre-clean process recipe that is to be performed before the substrate process in some embodiments. In additional or alternative embodiments, GUI element 324 can enable the user to provide a custom pre-clean process sequence, in accordance with embodiments described with respect to FIG. 3B. Section 320 can further include one or more GUI elements (e.g., GUI elements 326, 328, etc.) that enable the user to provide an indication of a post-cleaning process that is to be performed at the one or more pieces of equipment (e.g., after the substrate process indicated by section 312 is performed). GUI element 326 can enable the user to provide or select an existing post-cleaning process recipe, as described above. In additional or alternative embodiments, GUI element 328 can enable the user to provide a custom post-clean process sequence, in accordance with embodiments described with respect to FIG. 3C. In some embodiments, section 320 can include additional GUI elements that enable the user to provide an indication of other cleaning processes associated with the substrate process. For example, section 320 can include GUI elements that enable the user to provide an indication of a periodic cleaning process (e.g., a cleaning process that is to be performed in view of a time parameter rather than in view of a substrate process performed at manufacturing equipment 124), and so forth.

As indicated above, section 320 can include a GUI element 324 that enables the user to provide a custom pre-clean process sequence. In response to the user engaging with GUI element 324, another portion of GUI 210 can enable the user to provide data associated with the custom pre-clean process sequence, in some embodiments. FIG. 3B depicts an example portion 330 of GUI 210 that enables the user to provide data associated with a custom pre-cleaning process sequence 332, according to some aspects of the present disclosure. In some embodiments, portion 330 can provide one or more GUI elements that enable the user to indicate one or more steps and/or operations associated with the pre-cleaning process sequence 332. For example, portion 330 can include a GUI element 334 that enables the user to add one or more steps and/or operations to the cleaning process sequence 332. GUI element 334 can be a button, or another type of GUI element. In response to detecting that the user has engaged with GUI element 334, the cleaning component that provides GUI 210 can update portion 330 to enable the user to provide data associated with the added steps and/or operations, in accordance with embodiments described herein.

In some embodiments, portion 330 can include a GUI element 336 that enables a user to provide an indication of an ordering of a respective step or operation of cleaning process sequence 332. For example, GUI element 336 can enable the user to indicate that a particular step and/or operation of cleaning process sequence 332 is to be performed first in the sequence, another step and/or operation is to be performed second in the sequence, and so forth. The ordering of a respective step or operation of sequence 332 can correspond to an ordering or priority at which each step or operation of sequence 332 is considered by system controller 142. Further details regarding the priority of a respective step and/or operation of sequence 332 are described with respect to FIGS. 4A-4B below.

In some embodiments, portion 330 can further include a GUI element 338 that enables a user to provide an indication of an event that can trigger execution of one or more instructions associated with the step and/or operation (referred to as a triggering event herein). In some embodiments, GUI element 338 can enable the user to select one or more triggering events (e.g., from a list of triggering events for system 100). For example, GUI element 338 can be a drop down menu, or other type of GUI element, that enables the user to select one or more triggering events from a pre-defined list of triggering events. In other or similar embodiments, GUI element 338 can enable the user to provide an indication (e.g., by typing, etc.) of the triggering event. As illustrated in FIG. 3B, one or more steps and/or operations of sequence 332 can be associated with an "always"-type triggering event. An "always" type triggering event can trigger execution of a step and/or operation of sequence 332 each instance that the sequence 332 is considered by system controller 142. In other or similar embodiments, one or more steps and/or operations of sequence 332 can be associated with other types of triggering events, such as a "substrate ID change" type triggering event (e.g., an event that triggers execution of a step and/or operation of sequence 332 when an identifier (ID) associated with a prior substrate at manufacturing equipment 124 is different from the ID associated with a current substrate at manufacturing equipment 124, etc.). Some examples of triggering events can also include "sequence ID change" type triggering events (e.g., events that trigger a step and/or operation when a sequence ID associated with a prior substrate is different from the sequence ID associated a current substrate), "lot ID change" type triggering events (e.g., events that trigger a step and/or operation when a lot ID associated with a prior substrate is different from the lot ID associated a current substrate), "process job (PJ) ID change" type triggering events (e.g., events that a trigger step and/or operation when a PJ ID associated with a prior substrate is different from the PJ ID associated a current substrate), "carrier ID change" type triggering events (e.g., events that trigger a step and/or operation when a carrier ID associated with a prior substrate is different from the carrier ID associated a current substrate), "a force pre-clean" type triggering event (e.g., events that trigger a step and/or operation when a force pre-clean condition defined by the user is satisfied), "equipment fault," type triggering events (e.g., events that trigger a step and/or operation when one or more pieces of manufacturing equipment 124 fail), and so forth.

Portion 330 can further include one or more GUI elements 340 that enable the user to provide an indication of one or more triggering conditions associated with initiating the step and/or operation of sequence 332. A triggering condition refers to one or more conditions that are to be satisfied in order to trigger execution of the step and/or operation of sequence 332. In some embodiments, a triggering condition can be associated with the triggering event provided by the user via GUI element 338. In other or similar embodiments, the triggering condition can be independent of the provided triggering event. As illustrated in FIG. 3B, the user can provide, using GUI elements 340, that an operation having a priority of "1" is to be performed if the chamber idle time is greater than or equal to 1200 seconds. In another example, the user can provide, using GUI elements 340, that an operation having a priority of "2" is to be performed if the number of substrates processed at a process chamber is greater than or equal to 1. Other types of triggering conditions can correspond to a thickness of a material deposited and/or etched from a surface of a substrate, a number of carriers that have been processed at manufacturing equipment 124, an amount of time that power equipment (e.g., RF power equipment) has been idle at manufacturing equipment 124, an amount of time that power (e.g., RF power) has been provided at manufacturing equipment 124, an amount of power (e.g., RF power, DC power) that has been provided at manufacturing equipment 124, and so forth. In some embodiments, in response to detecting that the user has engaged with one or more GUI elements 340, the cleaning component of system 100 can update GUI 210 to include an additional portion (not shown) that enables the user to define the one or more triggering conditions for a respective step and/or operation of sequence 332. For example, the additional portion of GUI 210 can enable the user to select or otherwise provide a type of triggering condition associated with the step and/or operation and provide an indication of the condition that is to be satisfied. In an illustrative example, the additional portion of GUI 210 can enable the user to select or otherwise provide a triggering condition of a substrate count and select or otherwise provide a condition that the value of the substrate count is to equal 1 in order for the step and/or operation to be triggered.

Portion 330 can include one or more GUI elements 342 that enable the user to provide an indication of whether system controller 142 is to perform steps and/or operations of sequence 332 one or more times (i.e., in a loop) before proceeding to the next step and/or operation of the sequence 332. As illustrated in FIG. 3B, the user can provide, using GUI elements 342, that an operation having a priority of "1" is to be performed twice before an operation having a priority of "2" is to be performed. In additional or alternative embodiments, GUI elements 342 can further enable the user to provide additional conditions associated with the number of times a step and/or operation of sequence 332 is to be performed. For example, GUI elements 342 can enable the user to provide that an operation having priority of "1" is to be performed twice, only if the chamber idle time is greater than or equal to 1200 seconds. Otherwise, the system controller 142 is to execute instructions associated with the operation having the priority of "2."

One or more GUI elements 344 of portion 330 can enable the user to define when a variable associated with a triggering condition is to be reset. As illustrated in FIG. 3B, the user can provide, using GUI elements 344, that a variable is to be reset automatically after execution of one or more steps and/or operations of cleaning process sequence 332 (e.g., indicated by "Auto Reset."). GUI elements 334 can enable the user to define other instances when a variable associated with a triggering condition is to be reset, in some embodiments.

Portion 330 can include one or more GUI elements 346 that enable the user to provide an indication of one or more process recipes 136 that are to be executed for the step and/or operation of sequence 332. In some embodiments, in response to detecting that the user has engaged with GUI elements 346, the cleaning component of system 100 can update GUI 210 to indicate one or more cleaning process recipes that are stored in data store 250. The user can select (e.g., click) on a particular cleaning process recipe that is to be executed for the step and/or operation of sequence 332. In other or similar embodiments, GUI elements 346 can enable the user to provide (e.g., upload) a file associated with a cleaning process recipe that is to be executed for the step and/or operation of sequence 332. As illustrated in FIG. 3B, GUI elements 346 can enable the user to select (or otherwise provide) multiple different process recipes 136 to be executed for the step and/or operation of sequence 332.

It should be noted that portion 330 can include additional GUI elements (not shown) that enable the user to provide additional data associated with one or more steps and/or operations of sequence 332. For example, portion 330 can include additional GUI elements that enable the user to provide (e.g., type) a name or ID associated with each step and/or operation of sequence 332. In another example, portion 330 can include an additional GUI element that enables the user to provide an indication of whether each step and/or operation of sequence 332 is to be considered by system controller 142 for execution at manufacturing equipment 124 regardless of whether an operation having a higher priority is executed by system controller 142 (referred to herein as a back-to-back cleaning process sequence). The user can alternatively provide an indication, using the additional GUI element, of whether only the triggered steps and/or operations (i.e., in view of the triggering event and/or triggering condition) having the highest priority are to be considered by system controller 142 for execution at manufacturing equipment 124 (referred to herein as a priority cleaning process sequence). For a priority cleaning process sequence, once an operation of sequence 332 is executed, operations having a lower priority than the triggered operations are not considered for execution. Portion 330 can further enable the user to indicate whether particular types of components are to be used during execution of operations of sequence 332. For example, portion 330 can include additional GUI elements that enable the user to provide an indication of whether a dummy substrate (e.g., a substrate that is designated for cleaning processes) is to be moved into a process chamber during one or more operations of sequence 332. The additional GUI elements can further enable the user to provide an indication of how to select which dummy substrate to be moved into the chamber (e.g., select the least recently used dummy substrate, etc.).

As indicated with respect to FIG. 3A, section 320 can include a GUI element 328 that enables a user to provide a custom post-clean process sequence. In response to the user engaging with GUI element 328, another portion of GUI 210 can enable the user to provide data associated with the custom post-clean process sequence, in some embodiments. FIG. 3C depicts an example portion 350 of GUI 210 that enables the user to provide data associated with a custom post-cleaning process sequence 352, according to some aspects of the present disclosure. In some embodiments, portion 350 can include one or more GUI elements that are the same or similar to GUI elements included in portion 330. For example, portion 350 can include one or more GUI elements 334 that enable a user to add one or more steps and/or operations to the cleaning process sequence 352, as described above. Portion 350 can also include one or more GUI elements 336 that enable the user to provide an indication of an ordering or a priority of a respective step or operation of cleaning process sequence 352, in accordance with previously described embodiments.

One or more GUI elements 338 can enable the user to provide an indication of an event that can trigger execution of instructions associated with a respective step and/or operation, as described previously. In some embodiments, the triggering events that can trigger a respective step and/or operation of cleaning process sequence 352 can correspond to the triggering events described with respect to sequence 332. For example, the triggering events can include an "always" type triggering event, an "equipment fault" type triggering event, and so forth. In other or similar embodiments, the triggering events that can trigger a step and/or operation of cleaning process sequence 352 can be different from the triggering events described with respect to sequence 332. For example, the triggering events can include a "sequence end" type triggering event (e.g., events that trigger a step and/or operation when a sequence of steps and/or operations associated with a substrate process are completed), a "last substrate from carrier" type triggering event (e.g., events that trigger a step and/or operation when a carrier associated with one or more prior substrates processed by manufacturing equipment 124 is empty), among other types of triggering events. In additional or alternative embodiments, portion 350 can provide one or more GUI elements 340, 342, 344, and 346, as described with respect to portion 330. Portion 350 can provide additional GUI elements that enable the user to provide additional data associated with a respective step and/or operation of cleaning process sequence 352, in accordance with previously described embodiments.

As indicated above, some embodiments of the present disclosure provide that a user can provide data associated with steps and/or operations of a pre-cleaning process sequence 332 via portion 330 of GUI 210 and/or data associated with steps, operations, and/or data associated with steps and/or operations of a post-cleaning process sequence 352 via portion 350 of GUI 210. However, it should be noted that the user can provide data associated with the pre- and/or post-cleaning process sequences via portion 330 or alternatively via portion 350, in some embodiments. It should also be noted that portion 330 and/or portion 350 can include GUI elements that enable the user to provided data associated with other cleaning processes (e.g., periodic cleaning processes, etc.), in accordance with embodiments described herein.

Referring back to FIG. 2, the user of system 100 can provide data associated with the pre-and/or post-cleaning process sequences via GUI 210, in accordance with previously described embodiments. In some embodiments, client device 106 can store the provided data at data store 250 (e.g., as data associated with cleaning process sequence 352). In other or similar embodiments, client device 106 can provide the data associated with cleaning process sequence 352 to sequencer engine 152. Process sequence data module 212 of sequencer engine 152 can be configured to obtain data associated with a cleaning process sequence (e.g., sequence 332, 352, etc.) provided by a user of system 100, as described above. In some embodiments, process sequence data module 212 can obtain process sequence data 252 from data store 250. In other or similar embodiments process sequence data module 212 can obtain process sequence data 252 directly from client device 106, as described above.

In some embodiments, process sequence data module 212 can determine whether the sequence provided by client device 106 satisfies a validation criterion in view of one or more conditions associated with the process chamber. For example, process sequence data module 212 can determine whether a particular step and/or operation of the sequence can be performed following another step and/or operation of the sequence, in view of one or more conditions and/or constraints associated with the process chamber. In response to determining the steps and/or operations can be performed in view of the conditions and/or constraints of the process chamber, process sequence data module 212 can determine that the sequence satisfies the validation criterion. In response to determining that the steps and/or operations cannot be performed in view of the conditions and/or constraints, process sequence data module 212 can determine that the sequence does not satisfy the validation criterion. In such embodiments, process sequence data module 212 can provide a notification to client device 106 indicating that the cleaning sequence cannot be performed at the process chamber. Client device 106 can provide the notification to the user (e.g., via GUI 210).

In response to process sequence data module 212 obtaining process sequence data 252, dependency tree generator module 214 can generate and/or update a dependency tree associated with the cleaning process sequence (e.g., sequence 332, 352) corresponding to the obtained process sequence data 252. The dependency tree can be a semantic dependency tree, in some embodiments. In some embodiments, dependency tree generator module 214 can parse through the process sequence data 252 and identify one or more cleaning criteria associated with the sequence of steps and/or operations of the sequence 332, 352. The cleaning criteria associated with the steps and/or operations of the sequence 332, 352 can correspond to data provided by the user via GUI elements 336, 338, 340, 342, 344, and/or 346 (e.g., step and/or operation priority, triggering event, triggering condition, loop, reset variable, clean recipe, etc.). Dependency tree generator module 214 can generate and/or update the dependency tree based on the triggering events and/or conditions of the identified cleaning criteria, in some embodiments. In some embodiments, dependency tree generator module 214 can further generate and/or update the dependency tree based on additional data associated with the sequence 332, 352 (e.g., whether sequence 332, 352 is a back-to-back process sequence or a priority process sequence, etc.).

Figure 4A:
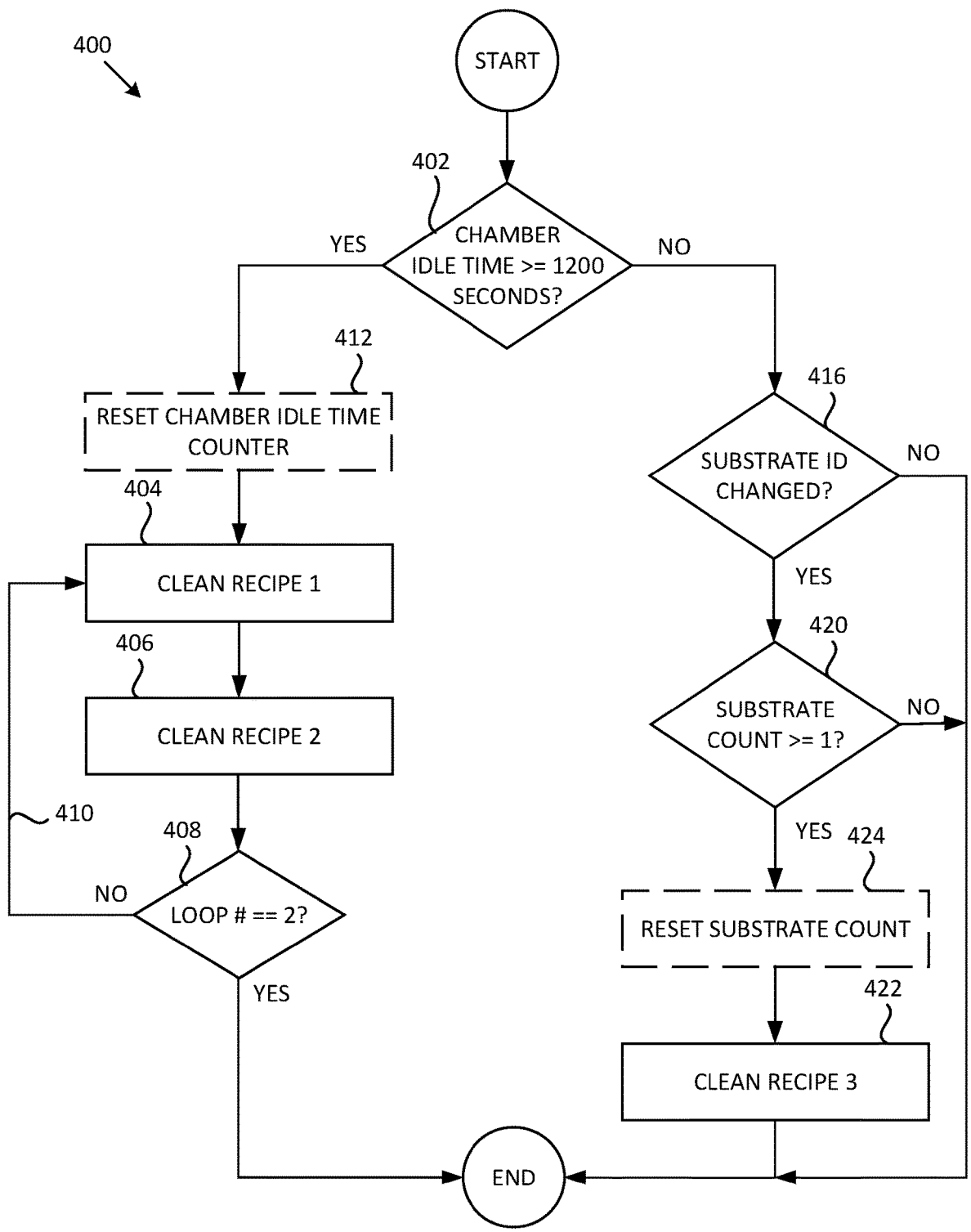
FIGS. 4A-4B illustrate example semantic dependency trees associated with a cleaning process, according to aspects of the present disclosure.

FIG. 4A illustrates an example semantic dependency tree 400 associated with pre-cleaning process sequence 332, according to some aspects of the present disclosure. Dependency tree 400 can include one or more nodes that correspond to cleaning criteria and/or cleaning process recipes provided by the user via portion 330 of GUI 210, as described above. As described with respect to FIG. 3B, instructions associated with a step and/or operation associated with a priority of "1" (referred to as a first step and/or operation of sequence 332) can be executed (i.e., in accordance with the "always" based triggering event) if the chamber idle time associated with a particular process chamber of manufacturing equipment 124 is equal to or greater than 1200 seconds (i.e., as defined by the triggering condition for the step and/or operation). If the triggering event and/or triggering condition associated with the first step and/or operation are satisfied, then instructions associated with cleaning process recipe 1 and cleaning process recipe 2 (i.e., as indicated by GUI element 346 of portion 330) are to be executed twice in a loop (i.e., as indicated by GUI element 342). As illustrated in FIG. 4A, dependency tree 400 can include a first node 402 that provides that a determination is to be made (e.g., by system controller 142), upon execution of the set of instructions associated with sequence 332, of whether the triggering condition for the step and/or operation is satisfied (i.e., whether the chamber idle time is equal or greater than 1200 seconds). The determination associated with node 402 can always be considered (e.g., by system controller 142) in accordance with the indication of the "always" type triggering event for the first step and/or operation of sequence 332, as described above.

If the triggering condition associated with node 402 is not satisfied, dependency tree 400 provides that node 416 is to be considered, in accordance with embodiments described below. If the triggering condition associated with node 402 is satisfied, cleaning process recipe 1 and cleaning process recipe 2 are to be performed (e.g., by system controller 142), as indicated by nodes 404 and 406 of dependency tree 400. After a performance of cleaning process recipes 1 and 2, node 408 provides that a determination is to be made as to whether each or cleaning process recipes 1 and 2 have been performed twice (i.e., in accordance with the loop condition indicated by GUI element 342 of portion 330). If cleaning process recipes 1 and 2 have not been performed twice, dependency tree 400 provides that cleaning process recipes 1 and 2 are to be performed again, as indicated by edge 410. If cleaning process recipes 1 and 2 have been performed twice, node 412 of dependency tree 400 provides that, optionally, the chamber idle time counter (i.e., which indicates the amount of time that the process chamber associated with sequence 332 has been idle) can be reset (e.g., in view of the "Auto Reset" indication of GUI element 344 of portion 330). In additional or alternative embodiments, the chamber idle time counter can be reset before operations associated with nodes 404-408 are performed, as illustrated in FIG. 4A.

In some embodiments, the user of system 100 can indicate (i.e., via GUI 210) whether sequence 332 is a back-to-back cleaning process sequence or a priority cleaning process sequence, as described above. If the user indicates that sequence 332 is a priority cleaning process sequence, dependency tree 400 can provide that sequence 332 is to terminate after cleaning process recipes 1 and 2 are performed (e.g., in accordance with the loop condition described above). If the user indicates that sequence 332 is a back-to-back cleaning process sequence, dependency tree 400 can provide that additional nodes associated with other steps and/or operations of sequence 332 are to be evaluated (e.g., by system controller 142), upon execution of the set of instructions associated with sequence 332.

As described with respect to FIG. 3B, instructions associated with a step and/or operation associated with a priority of "2" (referred to as a second step and/or operation of sequence 332) can be executed if a substrate ID triggering event has occurred (i.e., in accordance with the "substrate ID" type triggering event of GUI element 338) and if the number of substrates indicated by a substrate counter corresponds to and/or exceeds one substrate (i.e., in accordance with the triggering condition of GUI element 340). If the triggering event and the triggering condition associated with the second step and/or operation are satisfied, instructions associated with cleaning process recipe 3 (i.e., as indicated by GUI element 346) are to be executed once (i.e., in accordance with the loop condition indicated by GUI element 342). As illustrated in FIG. 4A, node 416 can provide that a determination is to be made as to whether a substrate ID has changed (i.e., in accordance with the triggering event of the second step and/or operation of sequence 332). If the substrate ID has not changed, dependency tree 400 provides that the steps and/or operations of sequence 332 are to be re-considered in accordance to order of priorities, (e.g., as indicated by the process or flow of tree 400 ending or terminating). If the substrate ID has changed, node 420 can provide that a determination is to be made as to whether the value of the substrate counter is greater than or equal to one (i.e., in accordance with the triggering condition of the second step and/or operation of sequence 332). If the substrate counter is not greater than or equal to one, dependency tree 400 provides that the steps and/or operations of sequence 332 are to be re-considered, as described above. If the substrate counter is greater than or equal to one, node 422 provides that cleaning process recipe 3 is to be performed (i.e., only once, in accordance with the loop condition indicated by GUI element 342). In some embodiments, after cleaning process recipe 3 is performed, node 424 indicates that the substrate counter is to be reset (i.e., in accordance with the "Auto Reset" indication of GUI element 344). In other or similar embodiments, the substrate counter can be reset before clean process recipe 3 is performed, as illustrated in FIG. 4A. After the substrate counter is reset and/or clean process recipe 3 is performed, dependency tree 400 provides that the steps and/or operations of sequence 332 are to be re-considered, as described above.

Figure 4B:
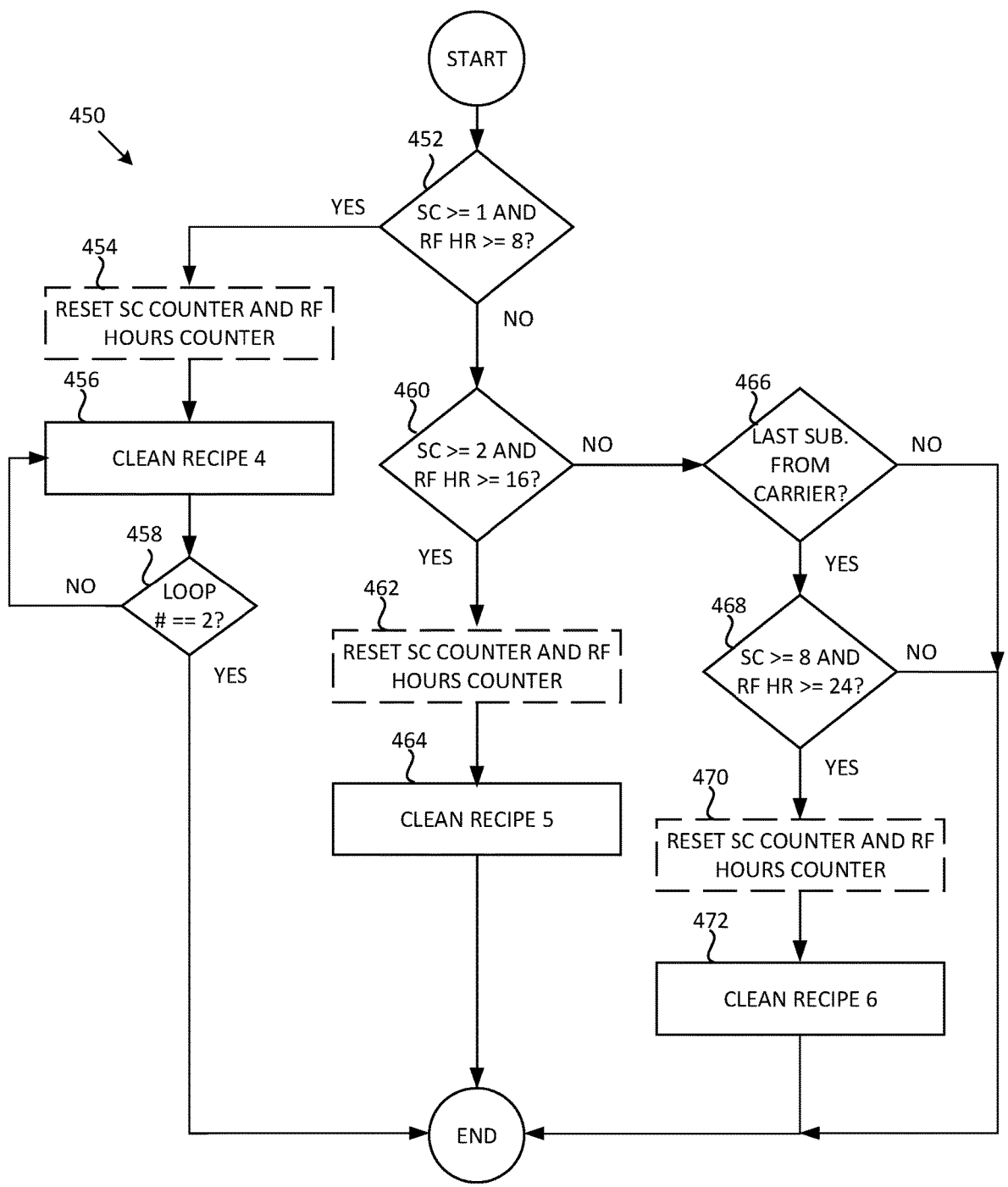

FIG. 4B illustrates another example semantic dependency tree 450 associated with post-cleaning process sequence 352, according to some aspects of the present disclosure. Dependency tree 450 can include one or more nodes that correspond to cleaning criteria and/or cleaning process recipes provided by the user via portion 350 of GUI 210, as described above. The nodes and edges of dependency tree 450 can correspond to the indications provided via GUI elements 336, 338, 340, 342, 344, and/or 346, as described with respect to FIGS. 3B and 4A above. For example, nodes 452, 454, 456 and/or 458 can correspond to a step and/or operation associated with a priority of "1" in sequence 352 (i.e., a first step and/or operation of sequence 352). Nodes 460, 462, and/or 464 can correspond to the second step and/or operation of sequence 352 (i.e., a step and/or operation associated with a priority of "2"). Nodes 466, 468, 470, and/or 472, can correspond to a step and/or operation associated with a second step and/or operation of sequence 352 (i.e., a step and/or operation associated with a priority of "3"). For purposes of explanation and illustration only, the dashed lines of dependency tree 450 can indicate optional flow paths of dependency tree 450 (e.g., corresponding to whether sequence 352 is a back-to-back cleaning process or a priority cleaning process). Additionally, "SC" included in FIG. 4B refers to "substrate count" and "CH" included in FIG. 4B refers to "chamber hours" in accordance with the triggering events and/or conditions of sequence 352.

Referring back to FIG. 2, dependency tree generator module 214 can generate a dependency tree associated with a respective cleaning sequence indicated by the user via GUI 210, such as dependency tree 400 and/or dependency tree 450 described above. Instruction set generator module 216 can generate a set of instructions associated with the cleaning sequence based on the generated dependency tree, in some embodiments. For example, instruction set generator module 216 can parse through a dependency tree and translate each node and edge into instructions that correspond to respective operations of the sequence of operations. In some embodiments, instruction set generator module 216 can include instructions associated with a respective process recipe in the generated set of instructions. For example, in response to detecting that a node of a dependency tree corresponds to a particular process recipe 136 (e.g., cleaning process recipe 1 of node 404, cleaning process recipe 2 of node 406, etc.), instruction set generator module 216 can identify the process recipe 136 from data store 250 and/or one or more libraries (e.g., from clean library 134) that correspond to the identified process recipe 136. Instruction set generator module 216 can include instructions associated with executing one or more operations for the identified process recipe 136 in the generated set of instructions, in some embodiments. In other or similar embodiments, instruction set generator module 216 can include a reference (e.g., a pointer, a mapping, etc.) to the identified process recipe 136. In some embodiments, instruction set generator module 216 can store the generated instruction set at data store 250 (e.g., as generated instruction set 254).

Instruction set execution module 220 of system controller 142 can be configured to execute the generated instruction set 254 in order to perform the cleaning process, in some embodiments. In some embodiments, instruction set execution module 220 can obtain the generated instruction set 254 (e.g., from data store 250 and/or from sequencer engine 152) and can execute the generated instruction set 254. The executed instruction set can cause the cleaning process to be performed at manufacturing equipment 124 in accordance with the sequence provided by the user via GUI 210.

In some embodiments, the user of system 100 can update and/or modify a cleaning process sequence via GUI 210, in accordance with previously described embodiments. For example, the user can add additional steps and/or operations to sequence 332 or 352, modify one or more process recipes and/or conditions associated with existing steps and/or operations of sequence 332 or 352, and/or modify a priority associated with each step, operation, and/or condition of sequence 332 or 352 via GUI 210. Client device 106 can provide an indication of the update and/or modification to the cleaning process sequence to sequencer engine 152, as described above. Dependency tree generator module 214 can update a dependency tree associated with the sequence in view of the indicated update and/or modification and instruction set generator module 216 can generate an updated set of instructions for the sequence, in accordance with previously described embodiments. Instruction set execution module 220 can execute the updated set of instructions to perform the updated and/or modified cleaning process sequence at manufacturing equipment 124, in accordance with previously described embodiments.

In some embodiments, one or more modules of sequencer engine 152 can use one or more machine learning models for obtaining an instruction set for the sequence. In one embodiment, dependency tree generator module 214 can use one or more machine learning models to generate dependency trees 400, 450 based on process sequence data 252. For example, dependency tree generator module 214 can provide process sequence data 252 as input to a machine learning model trained to generate a dependency tree based on given process sequence data. Dependency tree generator module 214 can obtain dependency tree 400 and/or 450 based on one or more outputs of the trained model. In an additional or alternative embodiment, instruction set generator module 216 can use one or more machine learning models to generate instruction set 254. For example, instruction set generator module 216 can provide a generated dependency tree (e.g., dependency trees 400, 450, etc.) and/or process sequence data 252 as input to a machine learning model trained to generate a set of instructions for a cleaning process based on a given dependency tree and/or process sequence data. Instruction set generator module 216 can obtain instruction set 254 based on one or more outputs of the trained model.

FIG. 5 is a flow diagram for an example method 500 of cleaning process sequence management, according to aspects of the present disclosure. FIG. 6 is a flow diagram for another example method 600 of cleaning process sequence management, according to aspects of the present disclosure. Methods 500 and/or 600 can be performed by processing logic that can include hardware (circuitry, dedicated logic, etc.), software (such as is run on a general purpose computer system or a dedicated machine), firmware, or some combination thereof. In one implementation, methods 500 and/or 600 can be performed by a computer system, such as computer system architecture 100 of FIG. 1. In other or similar implementations, one or more operations of methods 500 and/or 600 can be performed by one or more other machines not depicted in the figures. In some aspects, one or more operations of methods 500 and/or 600 can be performed by a cleaning process component, as described above.

For simplicity of explanation, the methods are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

Referring now to FIG. 5, at block 510, processing logic receives an indication of a sequence of cleaning operations associated with at least one substrate process at a manufacturing system and an indication of one or more cleaning criteria that trigger initiation of the sequence of cleaning operations during a cleaning process. In some embodiments, the processing logic can receive the indications from a client device, such as client device 106. A user of client device 106 can provide data associated with the cleaning operations and the one or more cleaning criteria via GUI 210, in accordance with previously described embodiments. The sequence of cleaning operations can correspond to sequence 332 and/or sequence 352, as described herein. The one or more cleaning criteria can correspond to a priority, a triggering event, a triggering condition, a loop, a reset variable, and/or any other cleaning criteria, in accordance with previously described embodiments.

At block 512, processing logic generates a set of instructions corresponding to the sequence of cleaning operations. In some embodiments, processing logic can generate the set of instructions by generating a dependency tree associated with the sequence of cleaning operations and generating the set of instructions based on the dependency tree (e.g., in accordance with embodiments described with respect to dependency tree generator module 214 and/or instruction set generator module 216 of FIG. 2). At block 514, processing logic detects that at least one of the one or more cleaning criteria is satisfied. For example, processing logic can detect that at least one of a priority, a triggering event, a triggering condition, etc. associated with the sequence is satisfied. At block 516, processing logic executes the generated set of instructions to initiate the sequence of cleaning operations at the process chamber.

As indicated above, FIG. 6 is a flow diagram for another example method 600 of cleaning process sequence management, according to aspects of the present disclosure. At block 610, processing logic provides a GUI of a cleaning process sequence component (also referred to as cleaning component herein) associated with a manufacturing system. The provided GUI can correspond to GUI 210, in some embodiments. At block 612, processing logic receives, via the GUI, an indication of a sequence of operations associated with a cleaning process to be performed at a process chamber of the manufacturing system. A user of system 100 can provide an indication of the sequence of operations via GUI elements of GUI 210, as described with respect to FIGS. 3A-3C. At block 614, processing logic generates a set of instructions associated with the cleaning process based on the provided indication of the sequence, in accordance with previously described embodiments. At block 616, processing logic transmits the generated set of instructions to a system controller (e.g., system controller 142) associated with the manufacturing system. System controller 142 can execute the generated set of instructions to perform the sequence of operations for the cleaning process, in accordance with previously described embodiments.

Figure 7:
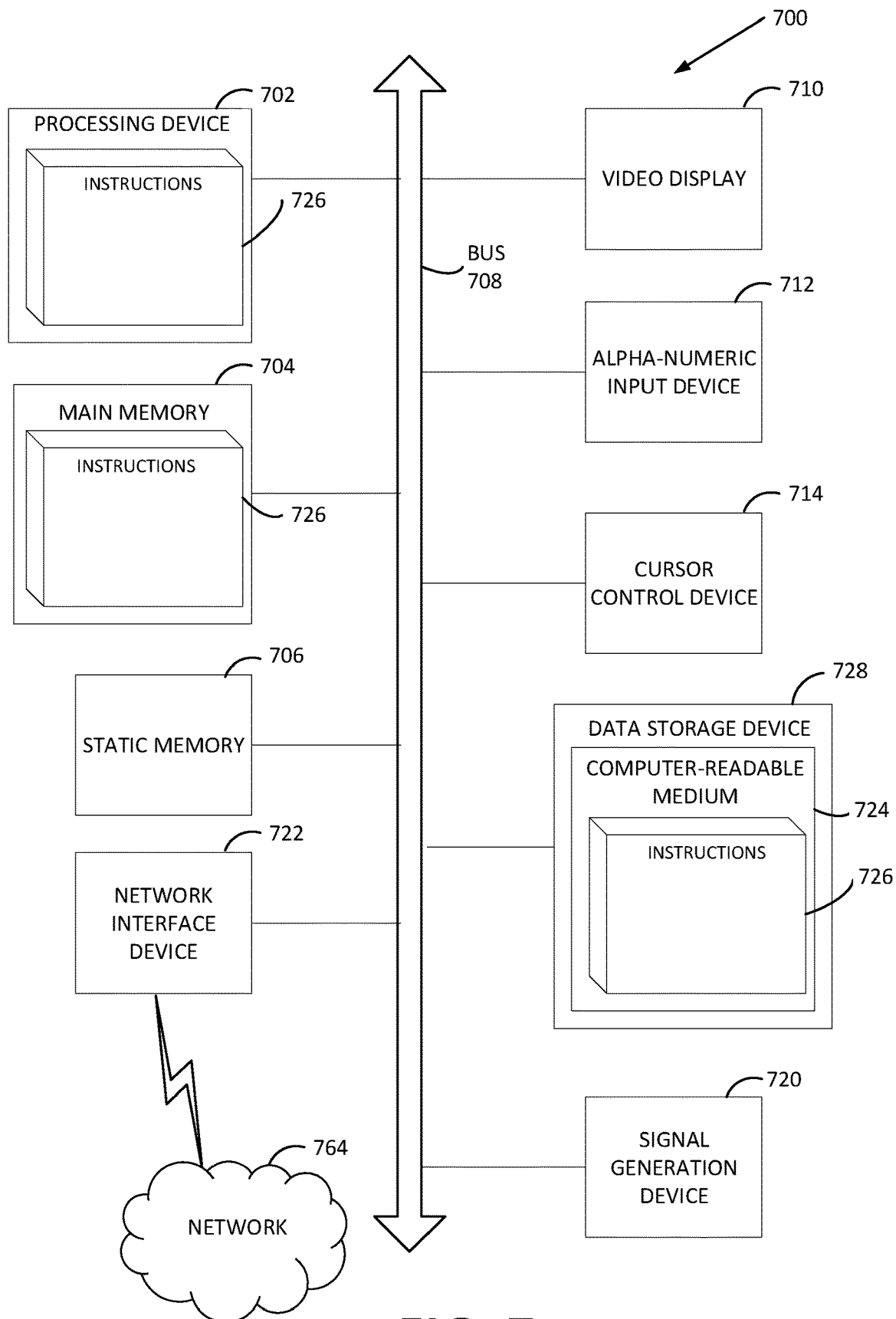
FIG. 7 is a block diagram illustrating a computer system, according to certain embodiments.

FIG. 7 is a block diagram illustrating a computer system 700, according to certain embodiments. FIG. 7 illustrates a diagrammatic representation of a machine in the example form of a computing device 700 within which a set of instructions, for causing the machine to perform any one or more of the methodologies discussed herein, can be executed. In alternative embodiments, the machine can be connected (e.g., networked) to other machines in a Local Area Network (LAN), an intranet, an extranet, or the Internet. The machine can operate in the capacity of a server or a client machine in a client-server network environment, or as a peer machine in a peer-to-peer (or distributed) network environment. The machine can be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In embodiments, computing device 700 can correspond to any of client device 106, server machine 140 and/or server machine 150 of FIG. 1.

The example computing device 700 includes a processing device 702, a main memory 704 (e.g., read-only memory (ROM), flash memory, dynamic random access memory (DRAM) such as synchronous DRAM (SDRAM), etc.), a static memory 706 (e.g., flash memory, static random access memory (SRAM), etc.), and a secondary memory (e.g., a data storage device 728), which communicate with each other via a bus 708.

Processing device 702 can represent one or more general-purpose processors such as a microprocessor, central processing unit, or the like. More particularly, the processing device 702 can be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. Processing device 702 can also be or include a system on a chip (SoC), programmable logic controller (PLC), or other type of processing device. Processing device 702 is configured to execute the processing logic (instructions 726) for performing operations and steps discussed herein.

The computing device 700 can further include a network interface device 722 for communicating with a network 764. The computing device 700 also can include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 720 (e.g., a speaker).

The data storage device 728 can include a machine-readable storage medium (or more specifically a non-transitory computer-readable storage medium) 724 on which is stored one or more sets of instructions 726 embodying any one or more of the methodologies or functions described herein. Wherein a non-transitory storage medium refers to a storage medium other than a carrier wave. The instructions 726 can also reside, completely or at least partially, within the main memory 704 and/or within the processing device 702 during execution thereof by the computer device 700, the main memory 704 and the processing device 702 also constituting computer-readable storage media.

While the computer-readable storage medium 724 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media.

The preceding description sets forth numerous specific details such as examples of specific systems, components, methods, and so forth in order to provide a good understanding of several embodiments of the present disclosure.

It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
receiving, from a client device coupled to a manufacturing system, an indication of a sequence of cleaning operations for a cleaning process associated with at least one of a plurality of substrate processes at the manufacturing system and an indication of one or more cleaning criteria that trigger initiation of the sequence of cleaning operations during the cleaning process at a process chamber of the manufacturing system;
generating a set of instructions corresponding to the sequence of cleaning operations;
determining whether the sequence of cleaning operations satisfies a validation criterion in view of one or more conditions associated with the process chamber; and
responsive to determining that the sequence of cleaning operations satisfies the validation criterion and detecting that a cleaning criterion of the one or more cleaning criteria is satisfied, executing the generated set of instructions to initiate the sequence of cleaning operations at the process chamber.

2. The method of claim 1, wherein generating the set of instructions corresponding to the sequence of cleaning operations comprises:
determining a triggering condition associated with the sequence of cleaning operations in view of the one or more cleaning criteria received from the client device;
updating a semantic dependency tree in view of the determined triggering condition, wherein the updated semantic dependency tree comprises one or more nodes that correspond to each cleaning operation of the sequence of cleaning operations; and
translating each cleaning operation associated with a respective node of the updated semantic dependency tree into one or more respective instructions of the set of instructions.

3. The method of claim 1, further comprising:
receiving, from the client device, an indication of a modified sequence of cleaning operations associated with the at least one of the plurality of substrate processes, wherein the modified sequence of cleaning operations includes one or more cleaning operations that are different than the sequence of cleaning operations;
generating an updated set of instructions corresponding to the modified sequence of cleaning operations; and
responsive to detecting that a cleaning criterion of the one or more cleaning criteria is satisfied, executing the updated set of instructions.

4. The method of claim 1, further comprising:
responsive to determining that the sequence of cleaning operations does not satisfy the validation criterion, transmitting a notification to the client device indicating that the sequence of cleaning operations cannot be performed at the process chamber.

5. The method of claim 1, wherein the indication of the sequence of cleaning operations is received responsive to a user of the manufacturing system providing the sequence of cleaning operations as input to a user interface provided by a cleaning process sequence component associated with the manufacturing system.

6. The method of claim 1, wherein the cleaning process corresponds to at least one of a pre-clean process to prepare the process chamber before execution of the at least one of the plurality of substrate processes or a post-clean process to clean the process chamber after execution of the at least one of the plurality of substrate processes.

7. The method of claim 1, wherein the plurality of substrate processes comprises at least one of an etch process or a deposition process.

8. A system comprising:
a memory; and
a processing device coupled to the memory, the processing device to:
provide a graphical user interface (GUI) of a cleaning process sequence component associated with a manufacturing system, wherein the GUI enables a user of the manufacturing system to provide a corresponding sequence of operations for one or more cleaning processes at the manufacturing system;
receive, via the GUI, an indication of a sequence of operations associated with a cleaning process to be performed at a process chamber of the manufacturing system;
generate a set of instructions associated with the cleaning process based on the indication of the sequence of operations and one or more cleaning criteria that trigger initiation of the sequence of operations; and
responsive to determining that the sequence of cleaning operations satisfies a validation criterion in view of one or more conditions associated with the process chamber, transmit the generated set of instructions to a system controller associated with the manufacturing system, wherein the system controller is to perform the cleaning process at the process chamber in accordance with the generated set of instructions based on a detection that the one or more cleaning criteria associated with the sequence of cleaning operations are satisfied.

9. The system of claim 8, wherein to generate the set of instructions associated with the cleaning process, the processing device is to:
   determine a triggering condition associated with the sequence of operations of the cleaning process;
   update a semantic dependency tree in view of the determined triggering condition, wherein the updated semantic dependency tree comprises one or more nodes that correspond to each cleaning operation of the sequence of the cleaning operations; and
   translate each cleaning operation associated with a respective node of the updated semantic dependency tree into a respective instruction of the set of instructions.

10. The system of claim 8, wherein the processing device is further to:
   receive, via the GUI, an indication of a modified sequence of cleaning operations associated with the cleaning process, wherein the modified sequence of operations includes one or more cleaning operations that are different than the sequence of operations;
   generate an updated set of instructions corresponding to the modified sequence of cleaning operations; and
   transmit the updated set of instructions to the system controller.

11. The system of claim 8, wherein the processing device is further to:
   responsive to determining that the sequence of operations does not satisfy the validation criterion, update the GUI to include a notification indicating that the sequence of operations cannot be performed at the process chamber.

12. The system of claim 8, wherein the cleaning process corresponds to at least one of a pre-clean process to prepare the process chamber before execution of one or more substrate processes at the manufacturing system or a post-clean process to clean the process chamber after execution of the one or more substrate processes.

13. The system of claim 8, wherein the cleaning process corresponds to one or more of a plurality of substrate processes at the manufacturing system, the plurality of substrate processes comprising at least one of an etch process or a substrate process.

14. A non-transitory computer readable storage medium comprising instructions that, when executed by a processing device, cause the processing device to:
   receive, from a client device coupled to a manufacturing system, an indication of a sequence of cleaning operations associated with at least one of a plurality of substrate processes at the manufacturing system and an indication of one or more cleaning criteria that trigger initiation of the sequence of cleaning operations during a cleaning process at a process chamber of the manufacturing system;
   generate a set of instructions corresponding to the sequence of cleaning operations;
   determine whether the sequence of cleaning operations satisfies a validation criterion in view of one or more conditions associated with the process chamber; and
   responsive to determining that the sequence of cleaning operations satisfies the validation criterion and detecting that a cleaning criterion of the one or more cleaning criteria is satisfied, execute the generated set of instructions to initiate the sequence of cleaning operations at the process chamber.

15. The non-transitory computer readable storage medium of claim 14, wherein to generate the set of instructions corresponding to the sequence of cleaning operations, the processing device is to:
   determine a triggering condition associated with the sequence of cleaning operations in view of the one or more cleaning criteria received from the client device;
   update a semantic dependency tree in view of the determined triggering condition, wherein the updated semantic dependency tree comprises one or more nodes that correspond to each cleaning operation of the sequence of cleaning operations; and
   translate each cleaning operation associated with a respective node of the updated semantic dependency tree into a respective instruction of the set of instructions.

16. The non-transitory computer readable storage medium of claim 14, wherein the processing device is further to:
   receive, from the client device, an indication of a modified sequence of cleaning operations associated with the at least one of the plurality of substrate processes, wherein the modified sequence of cleaning operations includes one or more cleaning operations that are different than the sequence of cleaning operations;
   generate an updated set of instructions corresponding to the modified sequence of cleaning operations; and
   responsive to detecting that a cleaning criterion of the one or more cleaning criteria is satisfied, execute the updated set of instructions.

17. The non-transitory computer readable storage medium of claim 14, wherein the processing device is further to:
   responsive to determining that the sequence of cleaning operations does not satisfy the validation criterion, transmit a notification to the client device indicating that the sequence of cleaning operations cannot be performed at the process chamber.

18. The non-transitory computer readable storage medium of claim 14, wherein the indication of the sequence of cleaning operations is received responsive to a user of the manufacturing system providing the sequence of cleaning operations as input to a user interface provided by a cleaning process sequence component associated with the manufacturing system.

19. The non-transitory computer readable storage medium of claim 14, wherein the cleaning process corresponds to at least one of a pre-clean process to prepare the process chamber before execution of the at least one of the plurality of substrate processes or a post-clean process to clean the process chamber after execution of the at least one of the plurality of substrate processes.

20. The non-transitory computer readable storage medium of claim 14, wherein the plurality of substrate processes comprise at least one of an etch process or a deposition process.

* * * * *